United States Patent
Chen et al.

(10) Patent No.: US 8,043,872 B2
(45) Date of Patent: Oct. 25, 2011

(54) EPITAXIAL MATERIAL USED FOR GAN BASED LED WITH LOW POLARIZATION EFFECT AND MANUFACTURING METHOD THEREOF

(75) Inventors: Hong Chen, Beijing (CN); Haiqiang Jia, Beijing (CN); Liwei Guo, Beijing (CN); Wenxin Wang, Beijing (CN); Junming Zhou, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 447 days.

(21) Appl. No.: 12/377,196

(22) PCT Filed: Aug. 15, 2007

(86) PCT No.: PCT/CN2007/002461
§ 371 (c)(1),
(2), (4) Date: Feb. 11, 2009

(87) PCT Pub. No.: WO2008/022553
PCT Pub. Date: Feb. 28, 2008

(65) Prior Publication Data
US 2009/0236586 A1    Sep. 24, 2009

(51) Int. Cl.
H01L 21/00 (2006.01)
H01L 21/36 (2006.01)
H01L 21/20 (2006.01)

(52) U.S. Cl. ............. 438/22; 438/28; 438/29; 438/69; 438/481; 438/956; 257/E21.108; 257/E21.117; 257/E21.126; 257/E21.405

(58) Field of Classification Search ........... 257/E21.108, 257/E21.117, E21.126, E21.405
See application file for complete search history.

(56) References Cited

U.S. PATENT DOCUMENTS

| | | | |
|---|---|---|---|
| 6,043,515 A | 3/2000 | Kamiguchi et al. | |
| 7,842,527 B2 * | 11/2010 | Schmidt et al. | 438/29 |
| 2004/0135222 A1 | 7/2004 | Alfano et al. | |
| 2004/0256611 A1 | 12/2004 | Kim et al. | |
| 2006/0008941 A1 * | 1/2006 | Haskell et al. | 438/93 |
| 2006/0091404 A1 | 5/2006 | Shen et al. | |
| 2006/0244003 A1 * | 11/2006 | Ueda et al. | 257/103 |
| 2006/0261371 A1 * | 11/2006 | Kuroda et al. | 257/194 |
| 2007/0205407 A1 * | 9/2007 | Matsuo et al. | 257/13 |

* cited by examiner

*Primary Examiner* — Mohsen Ahmadi
(74) *Attorney, Agent, or Firm* — Connolly Bove Lodge & Hutz LLP

(57) ABSTRACT

A method of manufacturing epitaxial material used for GaN based LED with low polarization effect, which includes steps of growing n-type InGaAlN layer composed of GaN buffer layer (2) and n-type GaN layer (3), low polarizing active layer composed of InGaAlN multi-quantum well structure polarized regulating and controlling layer (4) and InGaAlN multi-quantum well structure light emitting layer (5) and p-type InGaAlN layer (6) on sapphire or SiC substrate (1) in turn. The method adds InGaAlN multi-quantum well structure polarized regulating and controlling layer, thus reduces polarization effect of quantum well active region.

7 Claims, 1 Drawing Sheet

EPITAXIAL MATERIAL USED FOR GAN BASED LED WITH LOW POLARIZATION EFFECT AND MANUFACTURING METHOD THEREOF

BACKGROUND OF THE INVENTION

1. Field of the Invention

The present invention relates to an epitaxial material used for GaN based LED and a method for manufacturing the same, particularly to an epitaxial material used for GaN based LED with low polarization effect by using quantum well regulating and controlling technology to reduce the polarization effect and a method for manufacturing the same.

2. Description of the Related Art

Wide-bandgap materials with GaN as a representative are third generation semiconductors successive of Si and GaAs semiconductors, which is developed rapidly in the nineties of the last century due to the breakthrough of the epitaxial growing technology. Within less than ten years, GaN becomes a very hot subject for study worldwidely, while the LED possesses a major part among the GaN market. Presently, it had been already industrialized to utilize C-plane and A-plane sapphire substrate for fabricating GaN based LED. Normally we use epitaxial technology to grow GaN based LED on C-plane sapphire substrate to obtain C-plane GaN. Because III-V Nitride material has a spatial structure without space inversion symmetry, and the electronegativity of atom of V group elements is far different from that of N, there is a strong polarization along <0001> of GaN, thus the polarization effect will generate a built-in electric field with rather high intensity, and spatially separate positive and negative charge carriers, which results in red shift of emission wavelength, and even worse reduction in wave function overlap of electron and hole, so as to greatly decrease the light emission efficiency of the material.

Recently, the highest inner quantum efficiency of GaN based blue LED in the world market reaches 40-60% only, and commonly only 20%. While the LED of GaAs system without polarization effect can reach 100% highest inner quantum efficiency, with the common products reaching about 70% inner quantum efficiency. That is why the study of growing GaN with non-polarized plane and cancelling the spatial separation of electron and hole becomes one very important approach for increasing light emission efficiency of LED.

Because of the poor crystal quality of GaN, its dislocation density reaches $10^8$-$10^{10}$/cm$^{-2}$, and its strong polarization effect severely restrains the light emission efficiency of LED. It is demonstrated in experiment that adding In in quantum well can effectively increase the light emission efficiency. The current main aspect believes that existence of In component results in a localization effect, which in turn increases the light emission efficiency of quantum well, However, due to the existence of the polarization effect, the effect of increasing the light emission efficiency caused by the localization effect is cancelled out to a great extent. The analysis shows that GaN based LED material with non-polarization effect will substantially increase the light emission efficiency of the quantum well, so as to essentially solve the problem of how to obtain GaN based LED with high efficiency.

Currently, there are two solutions for growing GaN based quantum well with non-polarization effect: the first one is to select substrate with non-polarized plane to grow the material without polarization effect; the second one is to grow AlInGaN quaternary alloy material, the compositions of which is suitably selected in order to counteract the polarization effect.

The first solution has two ways, one is to grow (1-100) M-plane GaN on (001) substrate of γ-LiAlO2 by MBE technology, the main difficulty of which is the poor thermal stability of γ-LiAlO2 and high dopant concentration of the grown GaN material background, another one is to grow non-polarized A-plane GaN material on R-plane sapphire substrate, the main difficulty of which is that the A-plane GaN epitaxial material presents severe non-symmetry, the epitaxial material can hardly grow in two-dimensional layer status. A difficulty of the second solution is that it is hard to grow a material completely counteracting the polarization effect.

Therefore, it is really desirable to introduce an improved method for growing an epitaxial material for GaN based LED with low polarization effect.

SUMMARY OF THE INVENTION

One object of the invention is to provide an epitaxial material for GaN based LED with low polarization effect and a method for manufacturing said material to overcome the aforesaid problems, i.e. the present invention adopts combination of regulating and controlling quantum well structure and quantum well active region structure to enable the energy band of the quantum well active region to bend in inversed direction by energy band engineering, which actually lowers polarization effect of the quantum well active region, so as to achieve low polarization effect of the quantum well active region, increase overlapping of electron and hole wave function, and increase the concentration of the electron to further increase the light emission effect of the inner quantum of the LED, because the electron of the regulating and controlling quantum well region tunnels into the active region quantum well, thereby the problems of common GaN based LED quantum well active region, e.g. high intensity built-in electric field caused by strong polarization effect, red-shift of light emission wavelength caused by spatial separation of positive and negative charge carrier, and the even worse result of reducing overlapping of electron or hole wave function and lowering the light emission efficiency of the material, are solved.

In order to solve the above problems, the present invention provide a method for manufacturing an epitaxial material used for GaN based LED with low polarization effect, characterized in that said method comprises steps of:

tunneling electron or hole of quantum well with smaller energy gap into quantum well with larger energy gap during the process of manufacturing the polarized epitaxial material for GaN based LED, so as to increase light emission efficiency of the quantum well;

meanwhile, during the process of manufacturing the polarized epitaxial material for GaN based LED, reducing polarization effect of the quantum well having low polarization effect with the quantum well having high polarization effect and large interface charge by utilizing different interface charge of the quantum well caused by different polarization effect, so as to increase overlapping of electron or hole of the quantum well to increase light emission intensity of the epitaxial material used for GaN based LED; wherein said quantum well with smaller energy gap is the quantum well with designed light photon energy ranged from 2.0 eV to 4.95 eV;

said quantum well with larger energy gap is the quantum well with designed light photon energy ranged from 2.05 eV to 5.0 eV;

compared with the designed energy gap of said quantum well with larger energy gap, the designed energy gap of said quantum well with smaller energy gap is 50 meV to 400 meV less;

said quantum well with high polarization effect and large interface charge is the quantum well with interface charge ranged from 1E13 C/cm$^2$ to 5E14 C/cm$^2$; and said quantum well with low polarization effect is the quantum well with interface charge ranged from 5E11 C/cm$^2$ to 1E14 C/cm$^2$.

The present invention adopts combination of regulating and controlling quantum well structure and quantum well active region structure to enable the energy band of the quantum well active region to bend in inversed direction by energy band engineering, so as to achieve low polarization effect of the quantum well active region, increase overlapping of electron and hole wave function, and increase the concentration of electron or hole to further increase the light emission efficiency of the inner quantum of the LED, because of electron or hole of the regulating and controlling quantum well region tunnels into the quantum well active region.

The method for manufacturing an epitaxial material used for GaN based LED with low polarization effect according to the present invention particularly comprises steps of:

growing in turn on a substrate of sapphire or SiC, an n-type InGaAlN layer, an low polarizing active layer and a p-type InGaAlN layer by conventional semiconductor device deposition technology to obtain epitaxial material used for GaN LED with low polarization effect and high inner quantum efficiency; wherein said n-type InGaAlN layer is composed of a GaN buffer layer and an n-type GaN layer overlaid on the substrate in turn;

said GaN buffer layer is a transition layer composed of a GaN layer, an AlN layer, an AlGaN layer, an InGaN layer, an InAlN layer, an InAlGaN layer or a combination thereof epitaxial on a heterogeneous substrate; the thickness of said GaN buffer layer is 10 nm to 3 μm;

said n-type GaN layer is an n-type Ohmic contact layer composed of a GaN layer, an AlN layer, an AlGaN layer, an InGaN layer, an InAlN layer, an InAlGaN layer or a combination thereof; the thickness of said n-type GaN layer is 20 nm to 5 μm;

said low polarizing active layer is composed of an InAlGaN multi-quantum well structure polarized regulating and controlling layer and an InAlGaN multi-quantum well structure light emitting layer;

said InAlGaN polarized regulating and controlling layer is a multi-quantum well structure composed of a first barrier layer $In_{y1}Al_{z1}Ga_{1-y1-z1}N$ and a first quantum well layer $In_{x1}Al_{m1}Ga_{1-x-m1}N$, where, y1<x1<0.1<x1<0.3, 0<y1<0.15, 0<z1<0.5, 0<m1<0.5; the thickness of the first barrier layer $In_{y1}Al_{z1}Ga_{1-y1-z1}N$ is 5 to 30 nm; the thickness of the first quantum well layer $In_{x1}Al_{m1}Ga_{1-x1-m1}N$ is 1 to 15 nm, dopant concentration of said first barrier layer $In_{y1}Al_{z1}Ga_{1-y1-z1}N$ and said first quantum well layer $In_{x1}Al_{m1}Ga_{1-x1-m1}N$ are both 0 to 5×10$^{18}$/cm$^3$, the periodicity of the quantum well structure is 1 to 20.

said InAlGaN multi-quantum well structure light emitting layer is an LED active layer formed in multi-quantum well structure composed of a second barrier layer $In_yAl_zGa_{1-y-z}N$ and a second quantum well layer $In_xAl_mGa_{1-x-m}N$, where, y<x, 0.1<x<0.3, 0<y<0.15, 0<z<0.5, 0<m<0.5; the thickness of the second barrier layer $In_yAl_zGa_{1-y-z}N$ is 5 to 30 nm; the thickness of the second quantum well layer $In_xAl_mGa_{1-x-m}N$ is 1 to 12 nm, dopant concentration of the second barrier layer $In_yAl_z(Ga_{1-y-z}N$ and the second quantum well layer $In_xAl_mGa_{1-x-m}N$ are both 0 to 5×10$^{18}$/cm$^3$, the periodicity of the quantum well structure is 1 to 20.

the energy gap of said InAlGaN multi-quantum well structure light emitting layer is 50 meV to 400 meV larger than the energy gap of said InAlGaN multi-quantum well structure polarized regulating and controlling layer; and said p-type GaN layer is a p-type Ohmic contact layer composed of a GaN layer, an InAlN layer, an AlGaN layer, an InAlGaN layer or a combination thereof, the thickness of the p-type GaN layer is 20 nm to 1 μm.

The present invention also provides an epitaxial material used for GaN based LED with low polarization effect manufactured by using the above described method, said material comprising a substrate, and an n-type InGaAlN layer, an low polarizing active layer and a p-type InGaAlN layer overlaid in turn on the substrate plane, wherein said substrate is sapphire or SiC substrate;

said n-type InGaAlN layer is composed of a GaN buffer layer and an n-type GaN layer overlaid in turn on the substrate;

said GaN buffer layer is a transition layer composed of a GaN layer, an AlN layer, an AlGaN layer, an InGaN layer, an InAlN layer, an InAlGaN layer or a combination thereof epitaxial on a heterogeneous substrate; the thickness of said GaN buffer layer is 10 nm to 3 μm;

said n-type GaN layer is an n-type Ohmic contact layer composed of a GaN layer, an AlN layer, an AlGaN layer, an InGaN layer, an InAlN layer, an InAlGaN layer or a combination thereof; the thickness of said n-type GaN layer is 20 nm to 6 μm;

said low polarizing active layer is composed of an InAlGaN multi-quantum well structure polarized regulating and controlling layer and an InAlGaN multi-quantum well structure light emitting layer;

said InAlGaN polarized regulating and controlling layer is a multi-quantum well structure layer composed of a first barrier layer $In_{y1}Al_{z1}Ga_{1-y1-z1}N$ and a first quantum well layer $In_{x1}Al_{m1}Ga_{1-x1-m1}N$, where, y1<x1, 0.1<x1<0.3, 0<y1<0.15, 0<z1<0.5, 0<m1<0.5; the thickness of the first barrier layer $In_{y1}Al_{z1}Ga_{1-y1-z1}N$ is 5 to 30 nm; the thickness of the first quantum well layer $In_{x1}Al_{m1}Ga_{1-x1-m1}N$ is 1 to 15 nm, dopant concentration of said first barrier layer $In_{y1}Al_{z1}Ga_{1-y1-z1}N$ and said first quantum well layer $In_{x1}Al_{m1}Ga_{1-x1-m1}N$ are both 0 to 5×10$^{18}$/cm$^3$, the periodicity of the quantum well structure layer is 1 to 20.

said InAlGaN multi-quantum well structure light emitting layer is an LED active layer formed in multi-quantum well structure composed of a second barrier layer $In_yAl_zGa_{1-y-z}N$ and a second quantum well layer $In_xAl_mGa_{1-x-m}N$, where, y<x, 0.1<x<0.3, 0<y<0.15, 0<z<0.5, 0<m<0.5; the thickness of the second barrier layer $In_yAl_zGa_{1-y-z}N$ is 5 to 30 nm; the thickness of the second quantum well layer $In_xAl_mGa_{1-x-m}N$ is 1 to 12 nm, dopant concentration of the second barrier layer $In_yAl_zGa_{1-y-z}N$ and the second quantum well layer $In_xAl_mGa_{1-x-m}N$ are both 0 to 1×10$^{18}$/cm$^3$, the periodicity of the quantum well structure layer is 1 to 20.

the energy gap of said InAlGaN multi-quantum well structure light emitting layer is 50 meV to 400 meV larger than the energy gap of said InAlGaN multi-quantum well structure polarized regulating and controlling layer; and said p-type GaN layer is a p-type Ohmic contact layer composed of a GaN layer, an InAlN layer, an AlGaN layer, an InAlGaN layer or a combination thereof, the thickness of the p-type GaN layer is 20 nm to 1 μm.

The manufacturing method of the invention and epitaxial material used for GaN based LED with low polarization effect manufactured according to the manufacturing method of the invention are advantageous in comparison with the conventional non-polarized GaN material, the advantages are as follows:

The method of the present invention adopts conventional LED epitaxial technology process and unique energy band engineering design to accomplish manufacture of GaN based epitaxial material with low polarization effect.

The present invention avoids problems of several conventional technology of growing non-polarized GaN material, for example, poor thermal stability of γ-LiAlO2 and high dopant concentration of the grown GaN material background, and severe non-symmetry of grown A-plane GaN epitaxial material on R-plane substrate of sapphire, which results in difficulty for growing epitaxial material in two-dimensional layer status.

The present invention adopts combination of regulating and controlling quantum well structure and quantum well active region structure to enable the energy band of the quantum well active region to bend in inversed direction by energy band engineering, which actually lowers polarization effect of the quantum well active region, so as to achieve low polarization effect of the quantum well active region, increase overlapping of electron or hole wave function, and increase the concentration of the electron or hole to further increase the light emission effect of the inner quantum of the LED, because the electron or hole of the regulating and controlling quantum well region tunnels into the quantum well active region.

The conventional GaN based LED quantum well active region has problems of high intensity built-in electric field caused by strong polarization effect, red-shift of light emission wavelength caused by spatial separation of positive and negative charge carrier, and the even worse result of reducing overlapping of electron and hole wave function and greatly lowering light emission efficiency of the material, but the present invention provides the method for manufacturing an epitaxial material for GaN based LED with low polarization effect to solve these problems.

The present invention provides an epitaxial material for GaN based LED with low polarization effect, wherein the thickness and In composition of the InAlGaN multi-quantum well structure polarized regulating and controlling layer is modulated, and the thickness and In composition of the barrier layer and potential well layer of the InAlGaN multi-quantum well structure light emitting layer is modulated, so that the energy gap of said InAlGaN multi-quantum well structure light emitting layer is 50 meV to 400 meV larger than the energy gap of said InAlGaN multi-quantum well structure polarized regulating and controlling layer, and finally the energy band of the quantum well active region is enabled to bend in inversed direction, so as to lower the polarization effect of the quantum well active region.

The mechanism of the present invention is a method that increases light emission intensity on polarized epitaxial material for GaN based LED by making the electron or hole of the quantum well with different wavelength tunneling into the quantum well with short wavelength from the quantum well with long wavelength, i.e. a method that the electron or hole of the quantum well with lower energy band tunnels into the quantum well with higher energy band to increase light emission efficiency of the quantum well with higher energy band. This tunnel effect is completely different from the tunnel effect of non-polarized quantum well, for which the electron or hole with higher energy gap is tunneled into the quantum well with lower energy gap.

Further, the present invention also relates to reducing the polarization effect of the quantum well having low polarization effect with the quantum well having high polarization effect, i.e. the larger interface charge by taking advantage of different quantum well interface charge caused by different polarization effect on the polarized epitaxial material for GaN based LED, thereby increase overlapping of the electron or hole so as to increase the light emission intensity.

These and other advantages of the invention will be apparent to those of the skilled in the art by reference to the following detailed description with the accompanying drawings.

DETAILED DESCRIPTION OF THE PREFERRED EMBODIMENTS

Figure 1:
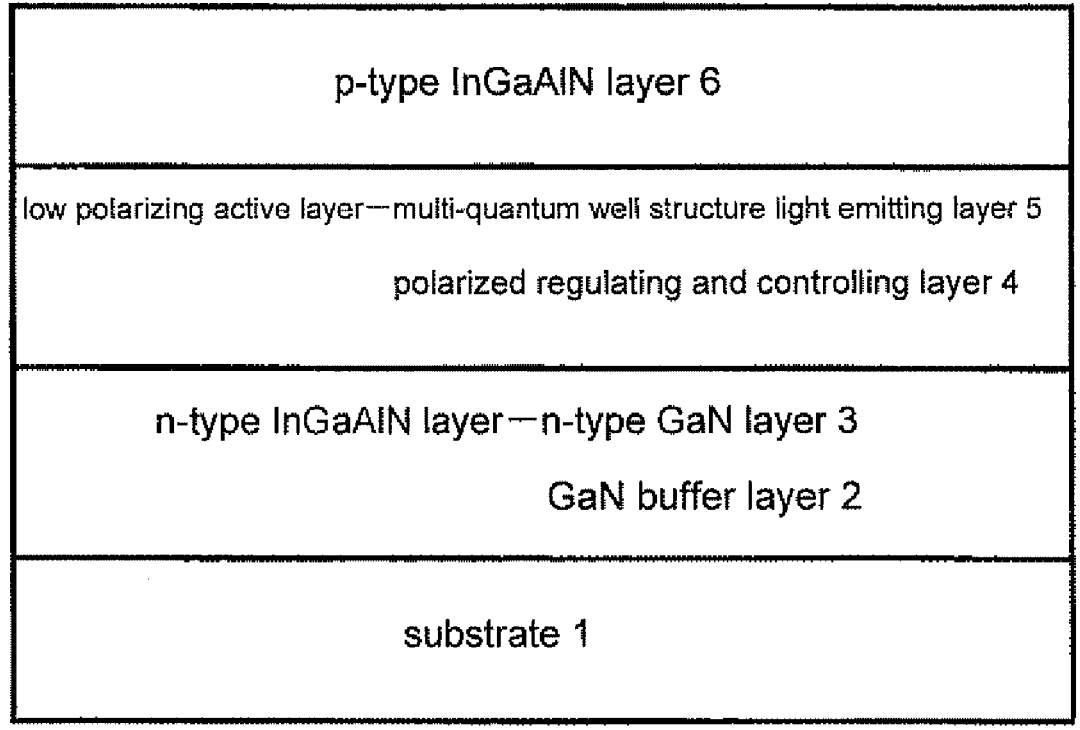
FIG. 1 is a schematic structure diagram for an epitaxial material used for GaN based LED with low polarization effect.

Now embodiments of the invention will be described with reference to the accompanying drawings. FIG. 1 is a schematic structure diagram for an epitaxial material used for GaN based LED with low polarization effect, Embodiment 1

The epitaxial material used for GaN based LED with low polarization effect is manufactured by using the method of the present invention, the method particularly comprises steps of:

adopting sapphire with a thickness of 0.43 mm as substrate 1; growing in turn on the substrate 1 by metal organic chemical vapor phase deposition (MOCVD) technology a GaN buffer layer 2 (composed of GaN) with a thickness of 10 nm, an n-type GaN layer 3 (composed of GaN) with a thickness of 2500 nm, an InGaN multi-quantum well structure polarized regulating and controlling layer 4 (a multi-quantum well structure with 2 periodicities composed of a GaN barrier layer and an $In_{0.15}Ga_{0.85}N$ quantum well layer, wherein the GaN barrier layer has a thickness of 10 nm, the $In_{0.15}Ga_{0.85}N$ quantum well layer has a thickness of 3.5 nm, dopant concentration of said GaN barrier layer is 0, dopant concentration of said $In_{0.15}Ga_{0.85}N$ quantum well layer is $1 \times 10^{18}/cm^3$, and corresponding peak of theoretical design light photon energy is 2.38 eV), an InGaN multi-quantum well structure light emitting layer 5 (a multi-quantum well structure with 5 periodicities composed of a $In_{0.01}Ga_{0.99}N$ barrier layer and an $In_{0.08}Ga_{0.92}N$ quantum well layer, wherein the $In_{0.01}(Ga_{0.99}N$ barrier layer has a thickness of 10 nm, the $In_{0.08}(Ga_{0.92}N$ quantum well layer has a thickness of 3 nm, dopant concentration of said $In_yGa_{1-y}N$ barrier layer is 0, dopant concentration of said $In_xGa_{1-x}N$ quantum well layer is $1 \times 10^{18}/cm^3$, and corresponding peak of theoretical design light photon energy is 2.64 eV), and a p-type InGaAlN layer 6 composed of a p-type $Al_{0.2}Ga_{0.8}N$ layer with a thickness of 200 nm and a p-type GaN layer with a thickness of 200 nm, so as to obtain an epitaxial material for GaN based blue LED with low polarization effect, as shown in FIG. 1.

Embodiment 2

The epitaxial material used for GaN based LED with low polarization effect is manufactured by using the method of the present invention, the method particularly comprises steps of:

adopting SiC with a thickness of 0.4 mm as substrate 1; growing in turn on the substrate 1 by metal organic chemical vapor phase deposition (MOCVD) technology a GaN buffer layer 2 (composed of AlN) with a thickness of 200 nm, an n-type GaN layer 3 with a thickness of 1 μm, an InGaN multi-quantum well structure polarized regulating and controlling layer 4 (a quantum well structure with 1 periodicity composed of a GaN barrier layer and an $In_{0.12}Ga_{0.88}N$ quantum well layer, wherein the GaN barrier layer has a thickness of 10 nm, the $In_{0.12}Ga_{0.88}N$ quantum well layer has a thickness of 4 nm, dopant concentration of said GaN barrier layer is 0, dopant concentration of said $In_{0.12}Ga_{0.88}N$ quantum well layer is $1\times10^{18}/cm^3$, and corresponding peak of theoretical design light photon energy is 2.4 eV), an InGaN multi-quantum well structure light emitting layer 5 (a multi-quantum well structure with 4 periodicities composed of a GaN barrier layer and an $In_{0.09}Ga_{0.91}N$ quantum well layer, wherein the GaN barrier layer has a thickness of 12 nm, the $In_{0.09}Ga_{0.91}N$ quantum well layer has a thickness of 2.5 nm, dopant concentration of said $In_yGa_{1-y}N$ barrier layer is $1\times10^{18}/cm^3$, dopant concentration of said $In_xGa_{1-x}N$ quantum well layer is 0, and corresponding peak of theoretical design light photon energy is 2.6 eV), and a p-type InGaAlN layer 6 (composed of InAlN) with a thickness of 300 nm, so as to obtain an epitaxial material for GaN based blue LED with low polarization effect, as shown in FIG. 1.

Embodiment 3

The epitaxial material used for GaN based LED with low polarization effect is manufactured by using the method of the present invention, the method particularly comprises steps of:
adopting sapphire with a thickness of 0.43 mm as substrate 1; growing in turn on the substrate 1 by metal organic chemical vapor phase deposition (MOCVD) technology a GaN buffer layer 2 (composed of AlN) with a thickness of 100 nm, an n-type GaN layer 3 with a thickness of 1 μm, an InGaN multi-quantum well structure polarized regulating and controlling layer 4 (a multi-quantum well structure with 5 periodicities composed of an $In_{0.05}Ga_{0.95}N$ barrier layer and an $In_{0.13}Ga_{0.87}N$ quantum well layer, wherein the $In_{0.05}Ga_{0.95}N$ barrier layer has a thickness of 10 nm, the $In_{0.13}Ga_{0.87}N$ quantum well layer has a thickness of 4 nm, dopant concentration of said GaN barrier layer is 0, dopant concentration of said $In_{0.13}Ga_{0.87}N$ quantum well layer is $5\times10^{17}/cm^3$, and corresponding peak of theoretical design light photon energy is 2.7 eV), an InGaN multi-quantum well structure light emitting layer 5 (a multi-quantum well structure with 4 periodicities composed of a GaN barrier layer and an $In_{0.10}Ga_{0.90}N$ quantum well layer, wherein the GaN barrier layer has a thickness of 12 nm, the $In_{0.10}Ga_{0.90}N$ quantum well layer has a thickness of 2 nm, dopant concentration of said $In_yGa_{1-y}N$ barrier layer is $1\times10^{17}/cm^3$, dopant concentration of said $In_xGa_{1-x}N$ quantum well layer is 0, and corresponding peak of theoretical design light photon energy is 3.1 eV), and a p-type InGaAlN layer 6 (composed of InAlN) with a thickness of 300 nm, so as to obtain an epitaxial material for GaN based purple LED with low polarization effect, as shown in FIG. 1.

Embodiment 4

The epitaxial material used for GaN based LED with low polarization effect is manufactured by using the method of the present invention, the method particularly comprises steps of:
adopting sapphire with a thickness of 0.43 mm as substrate 1; growing in turn on the substrate 1 by metal organic chemical vapor phase deposition (MOCVD) technology a GaN buffer layer 2 (composed of InAlN) with a thickness of 200 nm, an n-type GaN layer 3 (composed of InGaN) with a thickness of 5 μm, an InGaN multi-quantum well structure polarized regulating and controlling layer 4 (a multi-quantum well structure with 10 periodicities composed of an $In_{0.02}Ga_{0.98}N$ barrier layer and an $In_{0.15}Ga_{0.85}N$ quantum well layer, wherein the $In_{0.02}Ga_{0.98}N$ barrier layer has a thickness of 10 nm, the $In_{0.15}Ga_{0.85}N$ quantum well layer has a thickness of 5 nm, dopant concentration of said $In_{0.02}Ga_{0.98}N$ barrier layer is 0, dopant concentration of said $In_{0.15}Ga_{0.85}N$ quantum well layer is $5\times10^{17}/cm^3$, and corresponding peak of theoretical design light photon energy is 2.25 eV), an InGaN multi-quantum well structure light emitting layer 5 (a multi-quantum well structure with 20 periodicities composed of an $In_{0.05}Ga_{0.95}N$ barrier layer and an $In_{0.2}Ga_{0.8}N$ quantum well layer, wherein the $In_{0.05}Ga_{0.95}N$ barrier layer has a thickness of 12 nm, the $In_{0.2}Ga_{0.8}N$ quantum well layer has a thickness of 1.5 nm, dopant concentration of said $In_yGa_{1-y}N$ barrier layer is $2\times10^{17}/cm^3$, dopant concentration of said $In_xGa_{1-x}N$ quantum well layer is $1\times10^{17}/cm^3$, and corresponding peak of theoretical design light photon energy is 2.53 eV), and a p-type InAlGaN layer 6 with a thickness of 1 μm, so as to obtain an epitaxial material for GaN based LED with low polarization effect, as shown in FIG. 1.

Embodiment 5

The epitaxial material used for GaN based LED with low polarization effect is manufactured by using the method of the present invention, the method particularly comprises steps of:
adopting sapphire with a thickness of 0.43 mm as substrate 1; growing in turn on the substrate 1 by metal organic chemical vapor phase deposition (MOCVD) technology a GaN buffer layer 2 (composed of InAlGaN) with a thickness of 3 μm, an n-type GaN layer 3 (composed of InAlN) with a thickness of 200 nm, an InGaN multi-quantum well structure polarized regulating and controlling layer 4 (a multi-quantum well structure with 10 periodicities composed of an $In_{0.02}Ga_{0.98}N$ barrier layer and an $In_{0.15}Ga_{0.85}N$ quantum well layer, wherein the $In_{0.02}Ga_{0.98}N$ barrier layer has a thickness of 10 nm, the $In_{0.15}Ga_{0.85}N$ quantum well layer has a thickness of 5 nm, dopant concentration of said $In_{0.02}Ga_{0.98}N$ barrier layer is 0, dopant concentration of said $In_{0.15}Ga_{0.85}N$ quantum well layer is $5\times10^{17}/cm^3$, and corresponding peak of theoretical design light photon energy is 2.76 eV), an InGaN multi-quantum well structure light emitting layer 5 (a quantum well structure with 1 periodicity composed of a GaN barrier layer and an $In_{0.05}Ga_{0.95}N$ quantum well layer, wherein the GaN barrier layer has a thickness of 12 nm, the $In_{0.05}Ga_{0.95}N$ quantum well layer has a thickness of 2 nm, dopant concentration of said $In_yGa_{1-y}N$ barrier layer is $1\times10^{17}/cm^3$, dopant concentration of said $In_xGa_{1-x}N$ quantum well layer is $2\times10^{17}/cm^3$, and corresponding peak of theoretical design light photon energy is 3.16 eV), and a p-type InGaAlN layer 6 composed of a p-type GaN layer with a thickness of 700 nm, so as to obtain an epitaxial material for GaN based LED with low polarization effect, as shown in FIG. 1.

Embodiment 6

The epitaxial material used for GaN based LED with low polarization effect is manufactured by using the method of the present invention, the method particularly comprises steps of:
adopting sapphire with a thickness of 0.3 mm as substrate 1; growing in turn on the substrate 1 by metal organic chemical vapor phase deposition (MOCVD) technology a GaN buffer layer 2 with a thickness of 20 nm, an n-type GaN layer 3 with a thickness of 2 μm, an InGaN multi-quantum well structure polarized regulating and controlling layer 4 (a multi-quantum well structure with 2 periodicities composed of an $In_{0.01}Ga_{0.99}N$ barrier layer and an $In_{0.21}Ga_{0.79}N$ quantum well layer, wherein the $In_{0.01}Ga_{0.99}N$ barrier layer has a thickness of 10 nm, the $In_{0.21}Ga_{0.79}N$ quantum well layer has a thickness of 5 nm, dopant concentration of said $In_{0.01}Ga_{0.99}N$ barrier layer is 0, dopant concentration of said $In_{0.21}Ga_{0.79}N$ quantum well layer is $5\times10^{17}/cm^3$, and corresponding peak of theoretical design light photon energy is 2.58 eV), an InGaN multi-quantum well structure light emitting layer 5 (a multi-quantum well structure with 4 periodicities composed of a GaN barrier layer and an $In_{0.08}Ga_{0.92}N$ quantum well layer, wherein the GaN barrier layer has a thickness of 12 nm, the $In_{0.08}Ga_{0.92}N$ quantum well layer has a thickness of 2 nm, dopant concentration of said $In_yGa_{1-y}N$ barrier layer is 0, dopant concentration of said $In_xGa_{1-x}N$ quantum well layer is $2\times10^{17}/cm^3$, and corresponding peak of theoretical design light photon energy is 2.88 eV), and a p-type InGaAlN layer 6 composed of a p-type AlGaN layer with a thickness of 200 nm and a p-type GaN layer with a thickness of 100 nm, so as to obtain an epitaxial material for GaN based LED with low polarization effect, as shown in FIG. 1.

Embodiment 7

The epitaxial material used for GaN based LED with low polarization effect is manufactured by using the method of the present invention, the method particularly comprises steps of:

adopting sapphire with a thickness of 0.43 mm as substrate 1; growing in turn on the substrate 1 by metal organic chemical vapor phase deposition (MOCVD) technology a GaN buffer layer 2 (composed of InAlN) with a thickness of 500 nm, an n-type GaN layer 3 (composed of GaN) with a thickness of 5 μm, an InGaN multi-quantum well structure polarized regulating and controlling layer 4 (a multi-quantum well structure with 3 periodicities composed of an $In_{0.02}Al_{0.5}Ga_{0.48}N$ barrier layer and an $In_{0.06}Al_{0.4}Ga_{0.54}N$ quantum well layer, wherein the $In_{0.02}Al_{0.5}Ga_{0.48}N$ barrier layer has a thickness of 30 nm, the $In_{0.06}Al_{0.4}Ga_{0.54}N$ quantum well layer has a thickness of 15 nm, dopant concentration of said $In_{0.02}Al_{0.5}Ga_{0.48}N$ barrier layer is 0, dopant concentration of said $In_{0.06}Al_{0.4}Ga_{0.54}N$ quantum well layer is $5\times10^{17}/cm^3$, and corresponding peak of theoretical design light photon energy is 3.35 eV), an InGaN multi-quantum well structure light emitting layer 5 (a multi-quantum well structure with 3 periodicities composed of an $Al_{0.5}Ga_{0.5}N$ barrier layer and an $In_{0.05}Al_{0.05}Ga_{0.45}N$ quantum well layer, wherein the $Al_{0.5}Ga_{0.5}N$ barrier layer has a thickness of 20 nm, and the $In_{0.05}Al_{0.5}Ga_{0.45}N$ quantum well layer has a thickness of 6 nm, dopant concentration of said $Al_{0.5}Ga_{0.5}N$ barrier layer is $2\times10^{17}/cm^3$, dopant concentration of said $In_{0.05}Al_{0.5}Ga_{0.45}N$ quantum well layer is $1\times10^{17}/cm^3$, and corresponding peak of theoretical design light photon energy is 3.65 eV), and a p-type InGaAlN layer 6 with a thickness of 1 μm, so as to obtain an epitaxial material for GaN based LED with low polarization effect, as shown in FIG. 1.

Embodiment 8

The epitaxial material used for GaN based LED with low polarization effect is manufactured by using the method of the present invention, the method particularly comprises steps of:

adopting sapphire with a thickness of 0.43 mm as substrate 1; growing in turn on the substrate 1 by metal organic chemical vapor phase deposition (MOCVD) technology a GaN intrinsic layer 2 (composed of InAlN) with a thickness of 700 nm, an n-type GaN layer 3 (composed of GaN) with a thickness of 3 μm, an InGaN multi-quantum well structure polarized regulating and controlling layer 4 (a combination of a multi-quantum well structure and a quantum well structure, the multi-quantum well structure with 3 periodicities being composed of an $In_{0.02}Al_{0.5}Ga_{0.48}N$ barrier layer and an $In_{0.10}Al_{0.4}Ga_{0.50}N$ quantum well layer, the quantum well structure with 2 periodicities being composed of an $In_{0.02}Al_{0.3}Ga_{0.68}N$ barrier layer and an $In_{0.10}Al_{0.3}Ga_{0.60}N$ quantum well layer, wherein the $In_{0.02}Al_{0.5}Ga_{0.48}N$ barrier layer has a thickness of 30 nm and a dopant concentration of 0, the $In_{0.10}Al_{0.4}Ga_{0.50}N$ quantum well layer has a thickness of 15 nm and a dopant concentration of $5\times10^{17}/cm^3$, the $In_{0.02}Al_{0.3}Ga_{0.68}N$ barrier layer has a thickness of 20 nm and a dopant concentration of 0, the $In_{0.10}Al_{0.3}Ga_{0.60}N$ quantum well layer has a thickness of 15 nm and a dopant concentration of $5\times10^{17}/cm^3$, and corresponding peak of theoretical design light photon energy is 3.18 eV), an InAlGaN multi-quantum well structure light emitting layer 5 (a multi-quantum well structure with 3 periodicities composed of an $Al_{0.5}Ga_{0.5}N$ barrier layer and an $In_{0.03}Al_{0.4}Ga_{0.57}N$ quantum well layer, wherein the $Al_{0.5}Ga_{0.5}N$ barrier layer has a thickness of 20 nm, the $In_{0.03}Al_{0.4}Ga_{0.57}N$ quantum well layer has a thickness of 10 nm, dopant concentration of said $Al_{0.5}Ga_{0.5}N$ barrier layer is $2\times10^{17}/cm^3$, dopant concentration of said $In_{0.03}Al_{0.4}Ga_{0.57}N$ quantum well layer is $1\times10^{17}/cm^3$, and corresponding peak of theoretical design light photon energy is 3.38 eV), and a p-type InGaAlN layer 6 with a thickness of 1 μm, so as to obtain an epitaxial material for GaN based LED with low polarization effect, as shown in FIG. 1.

What is claimed is:

1. A method for manufacturing an epitaxial material used for a GaN based LED with a low polarization effect, characterized in that said method comprises steps of:

tunneling a electron or a hole of a quantum well with a smaller energy gap into the quantum well with a larger energy gap during a process of growing a polarized epitaxial material used for the GaN based LED, so as to increase light emission efficiency of the quantum well of the polarized epitaxial material;

simultaneously, during the process of growing the polarized epitaxial material used for the GaN based LED, reducing polarization effect of the quantum well having the low polarization effect with the quantum well having a high polarization effect and a large interface charge by utilizing a different interface charge of the quantum well caused by a different polarization effect, so as to increase overlapping of the electron or the hole of the quantum well to increase light emission intensity of the polarized epitaxial material used for the GaN based LED;

thereby growing a low polarizing active layer that is composed of an InAlGaN multi-quantum well structure polarized regulating and controlling layer and an InAlGaN multi-quantum well structure light emitting layer;

wherein:

said quantum well with a long wavelength of a lower energy band is the InAlGaN multi-quantum well structure polarized regulating and controlling layer having a smaller designed energy gap ranged from 2.0 eV to 4.95 eV;

said quantum well with a short wavelength of a higher energy band is the InAlGaN multi-quantum well structure light emitting layer having a larger designed energy gap ranged from 2.05 eV to 5.0 eV;

the smaller designed energy gap is 50 meV to 400 meV less than the larger designed energy gap;

said quantum well with the high polarization effect and the large interface charge is the quantum well having an interface charge ranged from $1\times10^{13}$ C/cm$^2$ to $5\times10^{14}$ C/cm$^2$; and said quantum well with the low polarization effect is the quantum well having an interface charge ranged from $5\times10^{11}$ C/cm$^2$ to $1\times10^{14}$ C/cm$^2$.

2. The method for manufacturing an epitaxial material used for the GaN based LED with the low polarization effect as claimed in claim 1, characterized in that said method further comprises a step of:

growing in turn on a substrate of sapphire or SiC, an n-type InGaAlN layer, the low polarizing active layer, and a p-type InGaAlN layer by a conventional semiconductor device deposition technology to obtain the polarized epitaxial material used for GaN LED with low polarization effect and high inner quantum efficiency;

wherein:

said n-type InGaAlN layer is composed of a GaN buffer layer and an n-type GaN layer overlaid on the substrate in turn;

said GaN buffer layer is a transition layer composed of a GaN layer, an AlN layer, an AlGaN layer, an InGaN layer, an InAlN layer, an InAlGaN layer or a combination thereof, epitaxial on a heterogeneous substrate;

said n-type GaN is an n-type Ohmic contact layer composed of a GaN layer, an AlN layer, an AlGaN layer, an InGaN layer, an InAlN layer, an InAlGaN layer or a combination thereof;

said InAlGaN polarized regulating and controlling layer is a multi-quantum well structure composed of a first barrier layer $In_{y1}Al_{z1}Ga_{1-y1-z1}N$ and a first quantum well layer $In_{x1}Al_{m1}Ga_{1-x1-m1}N$, where, $y1<x1$, $0.1<x1<0.3$, $0<y1<0.15$, $0<z1<0.5$, $0<m1<0.5$;

said InAlGaN multi-quantum well structure light emitting layer is an LED active layer formed in multi-quantum well structure composed of a second barrier layer $In_yAl_zGa_{1-y-z}N$ and a second quantum well layer $In_xAl_mGa_{1-x-m}N$, where, $y<x$, $0.1<x<0.3$, $0<y<0.15$, $0<z<0.5$, $0<m<0.5$; and said p-type GaN layer is a p-type Ohmic contact layer composed of a GaN layer, an InAlN layer, an AlGaN layer, an InAlGaN layer or a combination thereof.

3. The method for manufacturing an epitaxial material used for the GaN based LED with the low polarization effect as claimed in claim 2, characterized in that a thickness of said GaN buffer layer is 10 nm to 3 μm.

4. The method for manufacturing an epitaxial material used for the GaN based LED with the low polarization effect as claimed in claim 2, characterized in that a thickness of said n-type GaN is 20 nm to 5 μm.

5. The method for manufacturing an epitaxial material used for the GaN based LED with the low polarization effect as claimed in claim 2, characterized in that a thickness of the first barrier layer $In_{y1}Al_{z1}Ga_{1-y1-z1}N$ is 5 to 30 nm; a thickness of the first quantum well layer $In_{x1}Al_{m1}Ga_{1-x1-m1}N$ is 1 to 15 nm, dopant concentration of said first barrier layer $In_{y1}Al_{z1}Ga_{1-y1-z1}N$ and said first quantum well layer $In_{x1}Al_{m1}Ga_{1-x1-m1}N$ are both 0 to $5\times10^{18}$/cm$^3$, the periodicity of the quantum well is 1 to 20.

6. The method for manufacturing an epitaxial material used for the GaN based LED with the low polarization effect as claimed in claim 2, characterized in that a thickness of the second barrier layer $In_yAl_zGa_{1-y-z}N$ is 5 to 30 nm; a thickness of the second quantum well layer $In_xAl_mGa_{1-x-m}N$ is 1 to 12 nm, dopant concentration of the second barrier layer $In_yAl_zGa_{1-y-z}N$ and the second quantum well layer $In_xAl_mGa_{1-x-m}N$ are both 0 to $5\times10^{18}$/cm$^3$, the periodicity of the quantum well is 1 to 20.

7. The method for manufacturing an epitaxial material used for the GaN based LED with the low polarization effect as claimed in claim 1, characterized in that a thickness of the p-type GaN layer is 20 nm to 1 μm.

* * * * *